United States Patent [19]

Pitstick

[11] 4,204,204
[45] May 20, 1980

[54] ON/OFF SWITCH ARRANGEMENTS FOR A TOUCH CONTROL BAR GRAPH DEVICE

[75] Inventor: Martin H. Pitstick, Cleves, Ohio

[73] Assignee: General Electric Company, Louisville, Ky.

[21] Appl. No.: 909,593

[22] Filed: May 25, 1978

[51] Int. Cl.² .............................................. G08B 5/36
[52] U.S. Cl. .................................. 340/712; 340/753; 340/771; 340/803
[58] Field of Search ............. 200/52 R, DIG. 1, 5 A; 340/365 C, 712, 753; 219/453; 307/16

[56] References Cited

U.S. PATENT DOCUMENTS

| 3,492,440 | 1/1970 | Cerbone et al. | 200/DIG. 1 |
| 3,886,539 | 5/1975 | Gould Jr. | 340/365 C X |
| 4,121,204 | 10/1978 | Welch et al. | 200/5 A X |

Primary Examiner—James R. Scott
Attorney, Agent, or Firm—Bernard J. Lacomis; Radford M. Reams

[57] ABSTRACT

A safe and convenient ON/OFF switch arrangement for a touch control bar graph device of the type which includes an array of light transmitting touch-sensitive areas superimposed over a bar graph display. In order to require two operations to enable the touch control bar graph device, the present arrangement has an ON touch-sensitive area positioned adjacent to but spaced from the touch control bar graph device. A de-energizing touch-sensitive area is positioned in the space between the ON touch-sensitive area and the touch control bar graph device. Further, a circuit means is responsive to the ON and the de-energizing touch-sensitive areas for enabling operation of the touch control bar graph device in response to the touching of the ON touch-sensitive area, and for disabling touch control bar graph operation in response to the touching of the de-energizing touch-sensitive area. As a result, if a user attempts to enable operation of the touch control bar graph device by moving a finger directly between the ON touch sensitive area and the touch control bar graph device, the user's finger at least momentarily touches the de-energizing touch-sensitive area to disable the touch control bar graph device.

29 Claims, 15 Drawing Figures

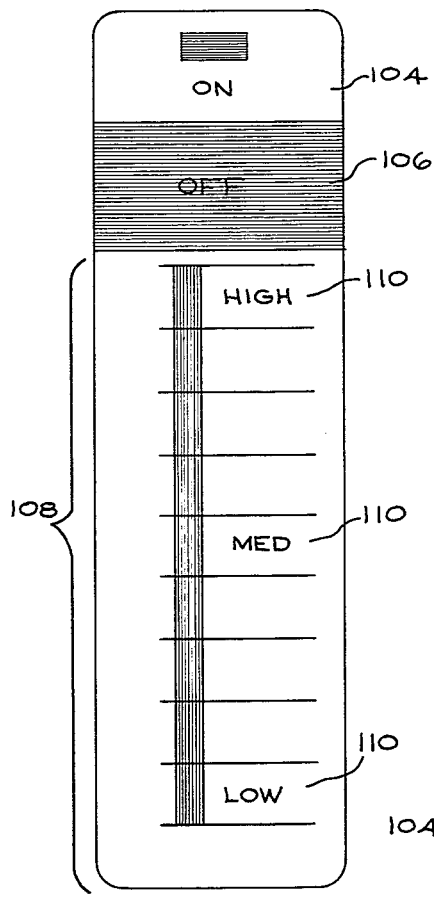
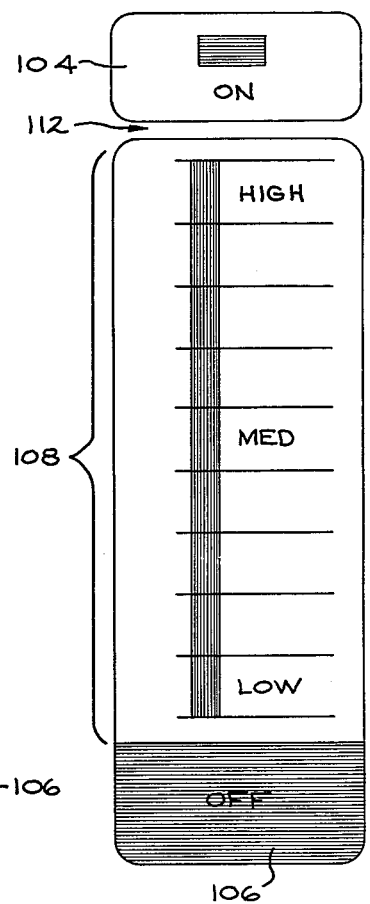
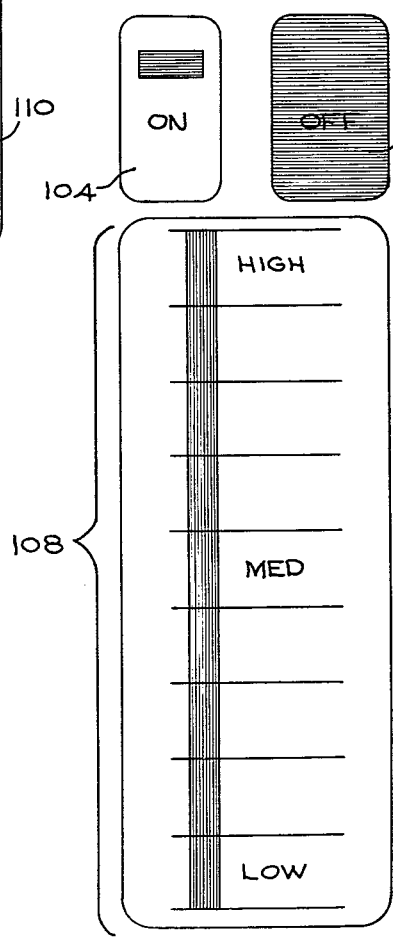

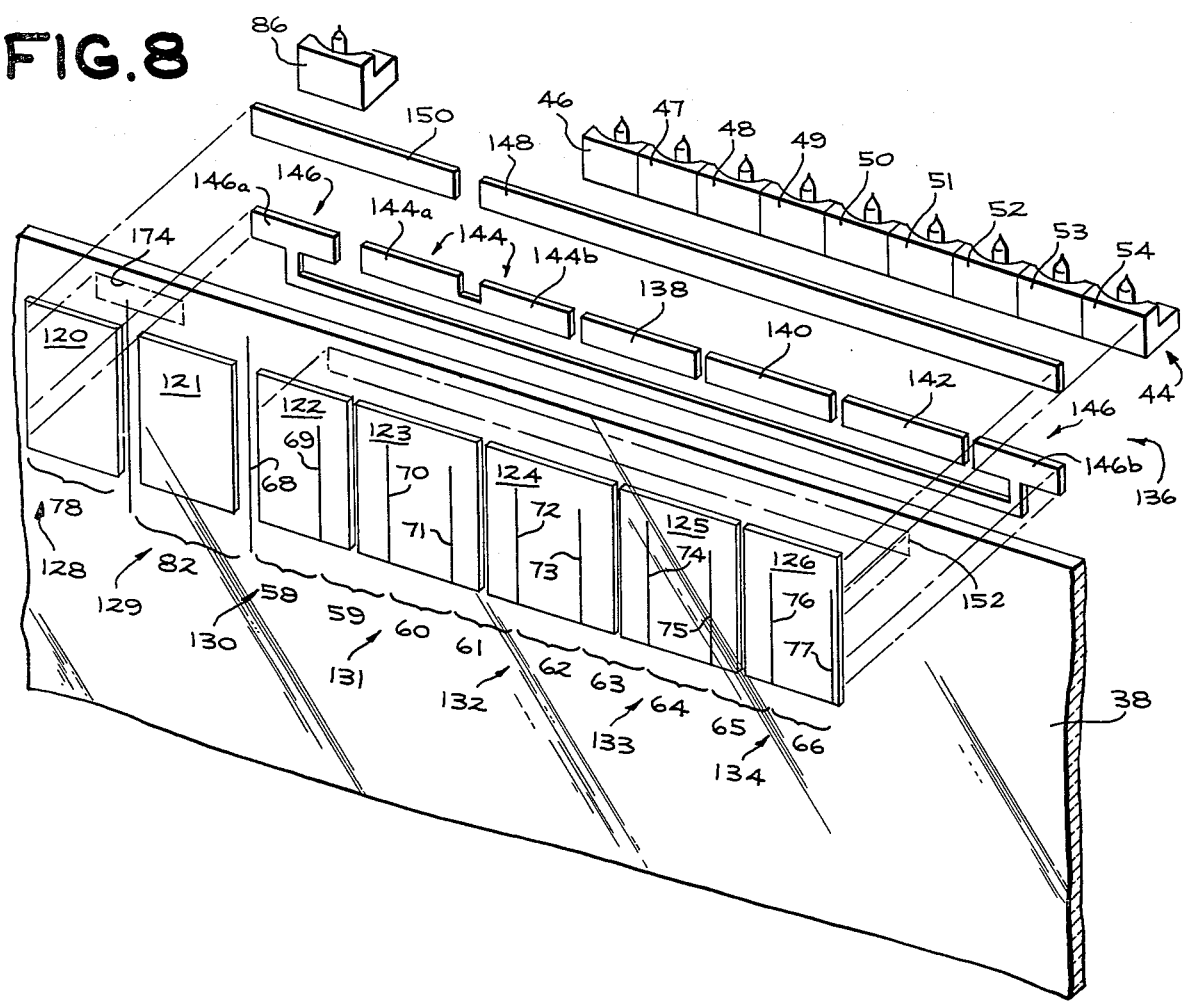

ON/OFF SWITCH ARRANGEMENTS FOR A TOUCH CONTROL BAR GRAPH DEVICE

CROSS REFERENCE TO RELATED APPLICATIONS

Touch control bar graph devices with which the present invention may be employed in combination are disclosed in the commonly-assigned copending application Ser. No. 750,559, filed Dec. 14, 1976, U.S. Pat. No. 4,121,204 by Stanley B. Welch, Juan de J. Serrano and David Y. Chen and entitled "Bar Graph Type Touch Switch and Display Device"; and in commonly-assigned copending application Ser. No. 908,317, filed May 22, 1978, by Juan de J. Serrano and entitled "High Density Capacitive Touch Switch Array Arrangement."

BACKGROUND OF THE INVENTION

The present invention relates generally to user input and display devices for controlling a range or the like and, more particularly, to ON/OFF switch arrangements for touch control bar graph devices such as are disclosed in the applications cross referenced above.

In the above-mentioned Welch, Serrano and Chen and the Serrano applications, devices are disclosed which advantageously and effectively combine touch switch user-input technology and bar graph display output technology to provide simple and readily understandable input/output devices herein referred to as touch control bar graph devices. More specifically, the display portion of a touch control bar graph device is a bar graph display which continuously and graphically represents a selected value, such as a range heat setting. The input portion is an array of touch-sensitive areas superimposed over the bar graph, permitting convenient changes to the setting with immediate reinforcing visual feedback to the user. In operation, the end of the bar graph display "follows" the tip of the user's finger in a unique and pleasing manner. Such touch control bar graph devices are a significant improvement over previously employed input/output devices for electronically controlled apparatus such as appliances, particularly when "human engineering" and user acceptability considerations are taken into account. The devices are readily understandable and permit the construction of unintimidating control panels which a person may use with confidence.

The previously disclosed touch control bar graph devices activate the load device, for example a range surface unit, whenever touched. Additionally, there is a separate "OFF" touch pad which turns off the touch control bar graph device and the load when touched.

In certain applications, and in particular in a control for a range surface unit, safety considerations are of utmost priority. In a range cooktop, the possibility of a surface heating unit being energized accidentally should be minimized. At the same time, interference with convenient operation of the appliance should be minimized to the extent possible consistent with safety considerations.

An Underwriters Laboratory requirement has addressed this particular concern. Specifically, in UL 858 pertaining to "Household Electric Ranges," Section 43 deals with "Unintentional Operation of Surface-Unit Controls."

UL Paragraph 43.1 requires, "The control for a surface unit shall require a minimum of two operations to activate the surface unit." In conventional, non-electronic ranges employing rotary switches and controls, the requirement of paragraph 43.1 is typically met by a switch having a push and a turn or a pull and a turn operating sequence. This particular solution is generally approved in paragraph 43.3 of the UL requirement. Lastly, paragraph 43.2 requires, "Only one operation shall be required to turn a surface unit off."

One example of a prior art electronic range including touch control input devices is disclosed in U.S. Pat. No. 3,819,906 issued to Gould, Jr. The Gould, Jr. range satisfies the UL "two operation" requirement by having "address pads," located near the right side of the control panel, for the individual surface cooking units. Separate "setting pads" numbered 0 through 9 are located near the center of the control panel and shared by all four surface units. Each of the "setting pads" corresponds to a particular heat value. To activate a heating unit of the Gould, Jr. range, a user first touches one of the "address pads" and then touches one of the setting pads.

SUMMARY OF THE INVENTION

Accordingly, it is an object of the invention to provide a convenient ON/OFF switch arrangement for use in combination with a touch control bar graph device.

It is another object of the invention to provide an ON/OFF switch arrangement for a touch control bar graph device, which arrangement enhances the safety of the appliance by requiring two operations for energization of a load, but which at the same time does not unduly detract from the user-acceptability of the touch control bar graph device.

It is still another object of the invention to provide a ON/OFF switch arrangement for a touch control bar graph employed as a domestic range surface unit control which satisfies Underwriters' laboratory's requirements.

Briefly stated and in accordance with one aspect of the invention, these and other objects are accomplished by an ON/OFF touch arrangement for a touch control bar graph device, which arrangement has an ON touch-sensitive area positioned adjacent to but spaced from the touch control bar graph device. There is a de-energizing touch sensitive area positioned in the space between the ON touch-sensitive area and the touch control bar graph device. A circuit means is responsive to the ON touch-sensitive area and to the de-energizing touch-sensitive area for enabling operation of the touch control bar graph device in response to the touching of the ON touch-sensitive area, and for disabling operation of the touch control bar graph device in response to the touching of the de-energizing touch sensitive area. As a result, if a user attempts to enable operation of the touch control bar graph device by moving a finger directly between the ON touch-sensitive area and the touch bar graph device, the user's finger at least momentarily touches the de-energizing touch-sensitive area to disable the touch control bar graph device. Essentially, then, this arrangement forces a user to first touch the ON touch-sensitive area, and then to lift his finger before placing it on the touch control bar graph device itself. The possibility of accidental turn on is greatly minimized, and the "two operation" Underwriter's Laboratory requirement should be satisfied.

Not only is safety enhanced by the present invention, but the close proximity of the ON touch-sensitive area to the touch control bar graph device makes the entire arrangement, from a user's viewpoint, easy to understand and to use. Thus there is minimal adverse effect on the basic simplicity (to the user) of a touch control bar graph device.

Briefly stated and in accordance with another aspect of the invention, the de-energizing touch sensitive area is a clearly designated OFF touch-sensitive area which corresponds to a particular touch switch touch pad. In further accordance with this particular aspect of the invention, the ON and OFF touch-sensitive areas may be positioned side by side at the left side of a horizontally oriented touch control bar graph device.

Briefly stated and in accordance with still another aspect of the invention, the ON touch-sensitive area corresponds to a particular touch switch touch pad and the de-energizing touch-sensitive area does not have an individual touch pad, but rather bridges both the touch pad corresponding to the ON touch-sensitive area and a touch pad of the touch control bar graph device. Suitable decoding logic recognizes the condition when the ON touch-sensitive area and the touch pad of the touch control bar graph device are both touched at once, to disable the touch control bar graph device.

Preferably, the OFF touch sensitive area is visually dominant compared to the ON touch-sensitive area. The visual dominance may be achieved by size and color.

In accordance with various other aspects of the invention, the touch control bar graph devices may be horizontally or vertically oriented, and the ON and OFF touch-sensitive areas may both be located at the same end of the touch control bar graph device, or at opposite ends. It is preferable that there be an indicator lamp for the ON touch sensitive area to indicate when the touch control bar graph is enabled.

In a range surface unit control application, the touch control bar graph devices have legends indicating values increasing from left to right in the case of a horizontally oriented bar graph device, and from bottom to top in the case of a vertically oriented bar graph device. The values represent particular range surface unit heat settings such as low, medium and high.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

FIG. 5 represents an arrangement which may be employed in combination with a vertically oriented touch control bar graph device;

FIG. 6 represents a preferred embodiment of the invention where a vertically oriented touch control bar graph device is employed;

FIG. 7 is another alternative embodiment of the invention for use in combination with a vertically oriented touch control bar graph device;

FIG. 8 is an exploded perspective view of the device of FIG. 2, showing details of construction not ordinarily visible to a user;

FIG. 9 is a sectional side view viewed from the right hand side of FIG. 8, and further showing a subpanel and a block schematic representation of circuit means forming part of the complete operative device;

DESCRIPTION OF THE PREFERRED EMBODIMENTS

Figure 1:
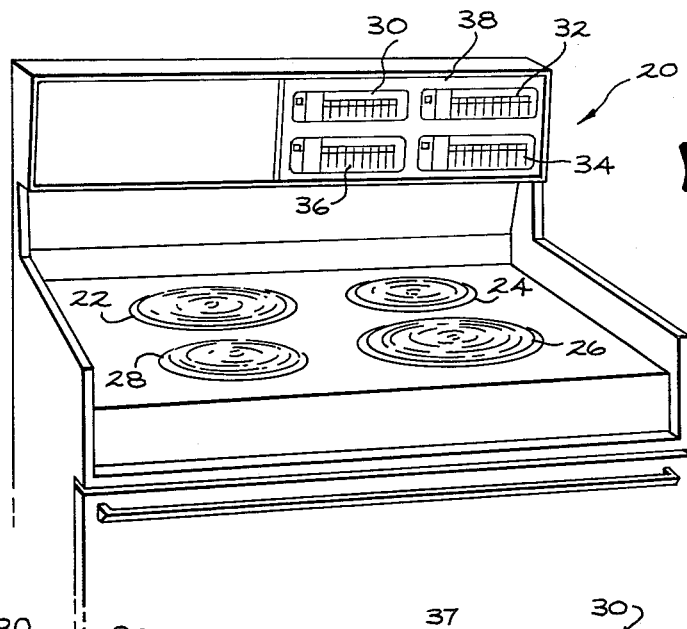
FIG. 1 is a perspective view of a portion of an electric range including bar graph type touch switch and display devices as the four surface unit heat controls, an ON/OFF switch arrangement according to the present invention being combined with each of the bar graph devices.

Referring first to FIG. 1, an electric range 20 includes four conventional electrical surface heating units 22, 24, 26, and 28. To provide user control over the heat produced by the surface heating units, four corresponding input/output devices 30, 32, 34 and 36 are disposed upon the right hand portion of the range control panel 38, which is formed of tempered glass approximately 3/16" thick for good appearance and cleanability. As will be apparent from the physical arrangement of the devices 30, 32, 34 and 36, the upper left input/output device 30 controls the left rear surface heating unit 22, the upper right input/output device 32 controls the right rear surface heating unit 24, and so on.

Figure 2:
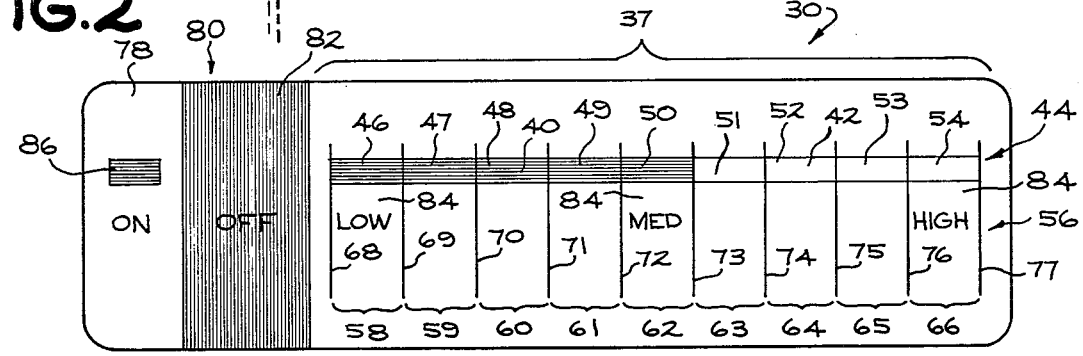
FIG. 2 is a greatly enlarged view of a single one of the controls of FIG. 1, and represents a preferred embodiment of the invention when touch control bar graph device is horizontally oriented.

Referring now to FIG. 2, there is shown a greatly enlarged view of representative input/output device 30 as it appears to the user when a "medium" heat setting for the left rear surface heating unit 22 has been selected. The largest part of the device 30 is a horizontally oriented touch control graph device 37 such as is disclosed in the Welch, Serrano and Chen and in the Serrano applications referred to above. To indicate to the user what heat setting has been selected, the touch control bar graph device 37 has a lighted bar graph display 40 visible through a suitable transparent window 42 in the panel 38. The bar graph display 40 actually comprises a linear array 44 of nine individual display segments 46 through 54 which are strung out such that each segment is adjacent the no more than two other segments. The segments are adapted to be progressively energized to form the bar graph type display 40 representing a particular value.

In order to provide a user input to the touch control bar graph device 37, a linear array 56 of light transmitting touch sensitive areas 58 through 66 is superimposed over the array 44 of display segments. The individual touch-sensitive areas 58 through 66 are delineated by line 68 through 77 forming left and right boundaries of the individual touch-sensitive areas. The delineating lines 68 through 77 may be applied in any suitable manner such as painting or silk screening. For ease of understanding a decoding arrangement hereinafter described, the areas 58, 60, 62, 64 and 66 are termed primary touch-sensitive areas, and the intermediate areas 59, 61, 63 and 65 are termed secondary touch-sensitive areas.

In accordance with the present invention, an ON touch-sensitive area 78 is positioned adjacent to but spaced from the touch control bar graph device 37. More particularly, the ON touch-sensitive area 78 is positioned adjacent to but spaced from the left end of the touch control bar graph device 37. A de-energizing touch-sensitive area 80 is positioned in the space between the on touch sensitive area 78 and the touch control bar graph device 37. More particularly, in the particular embodiment illustrated in FIG. 2, the de-energizing touch-sensitive area 80 is a clearly designated off touch sensitive area 82.

Circuit means, hereinafter described in more detail, is responsive to the ON touch-sensitive area 78 and to the de-energizing touch-sensitive area 80 (more particularly shown as the OFF touch-sensitive area 82) for enabling operation of the touch control bar graph device 37 in response to the touching of the ON touch-sensitive area 78 and for disabling operation of the touch control bar graph device 37 in response to the touching of the de-energizing touch-sensitive area 80.

For a user to activate the left rear surface unit 22 requires two operations: First, a touch on the ON touch sensitive area 78, and second, a touch on the touch control bar graph device 37. Any attempt by the user to enable operation of the touch control bar graph 37 by moving a finger between the ON touch sensitive area 78 and the touch control bar graph device 37 in one continuous motion results in at least a momentary touching of the OFF touch sensitive area 82, to disable the touch control bar graph device 37.

To complete the input/output device 30 of FIG. 2, the touch control bar graph device 37 has a plurality of legends 84 representing relative values increasing from left to right. More particularly, the legends "LOW," "MED" and "HIGH" represent range surface unit heat settings. The ON touch-sensitive area 78 also has an indicator display lamp 86 which may be similar to any one of the display segments 46 through 54 of the touch control bar graph device 37. The indicator display lamp 86 is connected to indicate when the touch control bar graph device 37 is enabled following touching of the ON touch-sensitive area 78.

From FIG. 2 it will also be seen that the OFF touch-sensitive area 82 is visually dominant compared to the ON touch sensitive area 78. In its particular embodiment, this visual dominance is achieved by size, but preferably the OFF touch sensitive area 82 is dominant compared to the ON touch sensitive area 78 by color as well.

Figure 3:
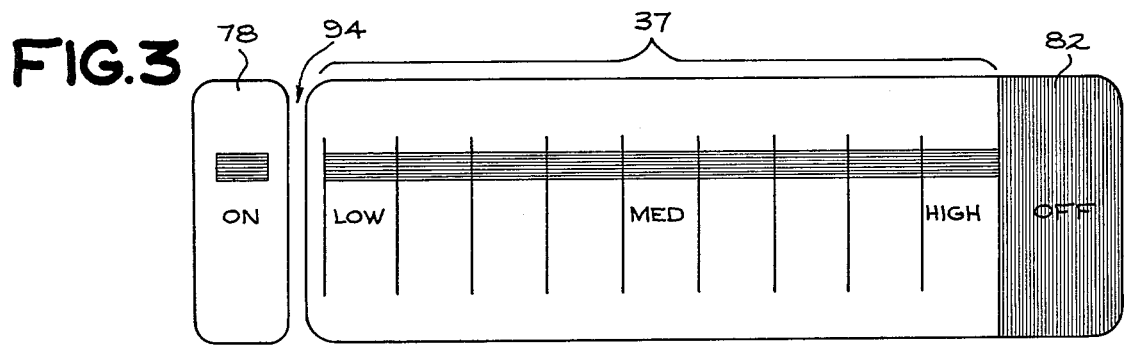
FIG. 3 is an alternative arrangement for a horizontally oriented touch control bar graph device.

Referring now to FIG. 3, there is illustrated an alternative embodiment of an ON/OFF touch switch arrangement for the horizontally oriented touch control bar graph device 37. In FIG. 3, the ON touch-sensitive area 78 is located at the left end of the touch control bar graph device 37, and the OFF touch-sensitive area 82 is located at the right hand end of the touch control bar graph device 37. It will be seen that the ON touch sensitive area 78 is adjacent but spaced from the touch control bar graph device 37, the space being designated 94. In this particular embodiment the ON touch-sensitive area 78 corresponds to a particular touch switch touch pad, and there is another touch switch touch pad associated with the left end of the touch control bar graph device 37. A de-energizing touch sensitive area bridges the touch pad corresponding to the ON touch-sensitive area 90 and the touch pad of the touch control bar graph device, over the space 94, such that a touch on the de-energizing touch-sensitive area contacts both of the touch pads. Logic means similar to that disclosed in the above-mentioned copending Serrano application Ser. No. 908,317 recognizes the condition when both of these touch pads are touched and generates a signal indicating the touching of the de-energizing touch-sensitive area 94.

Figure 4:
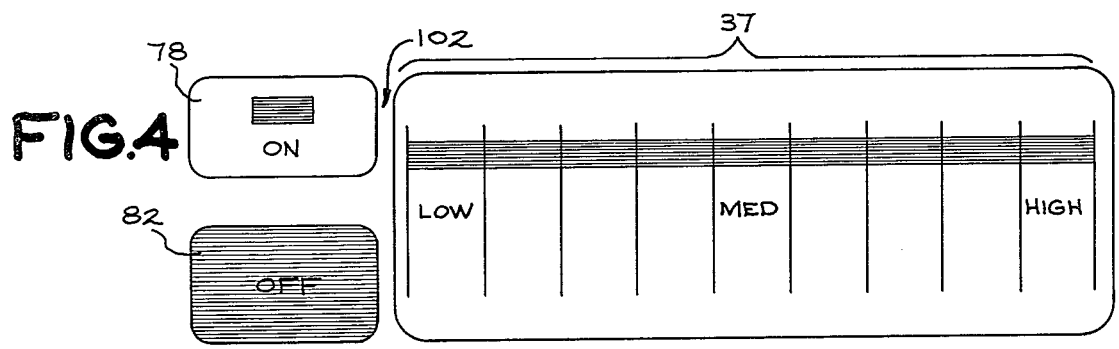
FIG. 4 is still another alternative arrangement for a horizontally oriented touch control bar graph device.

FIG. 4 depicts another ON/OFF switch arrangement for use in combination with the horizontally oriented touch control bar graph device 37. In FIG. 4, the ON and OFF touch-sensitive areas 78 and 82 are positioned at the left end of the touch control bar graph device 37, one above the other. The ON touch-sensitive area 78 is spaced from the touch control bar graph device 37, the space being designated 102. As in the FIG. 3 embodiment, the ON touch-sensitive area 78 corresponds to a particular touch switch touch pad, and a de-energizing touch-sensitive area over the space 102 bridges the touch pad corresponding to the ON touch-sensitive area 78 and a touch pad of the touch control bar graph device 37.

Various embodiments of the invention may be used in combination with vertically oriented touch control bar graph devices. In FIG. 5, ON and OFF touch-sensitive areas 104 and 106 are positioned at the upper end of a vertically oriented touch control bar graph device 108, the ON touch-sensitive area 104 being spaced from the touch control bar graph device 108 and the OFF touch-sensitive area 106 being positioned in the space. The vertically oriented touch control bar graph device 108 also has a plurality of legends 110 representing relative values increasing from bottom to top. As before, the legends 110 may represent range surface unit heat settings.

FIG. 6 represents a presently preferred embodiment of the invention where the vertically oriented touch control bar graph device 108 is employed. In FIG. 6, the OFF touch-sensitive area 106 is positioned at the lower end of the touch control bar graph device 108, and the ON touch-sensitive area 104 is positioned adjacent to but spaced from the upper end of the touch control bar graph device 108. The space 112 between the ON touch-sensitive area 104 and the touch control bar graph device 108 represents the approximate center of a de-energizing touch-sensitive area generated as before, by simultaneous touches on a touch pad corresponding to the ON touch-sensitive area 104 and a touch pad of the touch control bar graph device 108.

FIG. 7 is comparable to the arrangement of FIG. 4, except that it is for use in combination with the vertically oriented touch control bar graph device 108.

Turning now to FIGS. 8 and 9, the underlying constructional details of the representative input/output device 30 may be seen. FIG. 8 is an exploded perspective view of the various elements associated most directly with the glass panel 38, and FIG. 9 is a sectional right side view of the panel as assembled, together with additional elements. The specific underlying constructional details of FIGS. 8 and 9, as well as the exemplary circuits which follow, do not themselves form a part of the invention claimed herein, but merely represent one way of implementing the invention. It will be recognized that various aspects of the constructional details and of the circuitry are disclosed in the above-mentioned copending Welch, Serrano and Chen and Serrano applications.

Disposed on the front side of the panel 38 are seven transparent touch pads 120 through 126 which comprise the input elements of capacitive touch switches generally designated 128 through 134. It will be apparent that the thicknesses of the touch pads 120 through 126 are greatly exaggerated for clarity of illustration.

To complete the touch switches 128 through 134, conductive rear pads, generally designated 136, are disposed on the rear side of the panel 38. More specifically, individual transmitter pads 138, 140 and 142 are provided for the touch switches 131, 132, and 133, respectively. A single split transmitter pad 144 having portions 144a and 144b serves both the touch switches 129 and 130, and another split pad 146 having portions 146a and 146b serves the touch switches 128 and 134. A single receiver pad 148 serves the five touch switches 130 through 134 through a multiplexing arrangement hereinafter described. The "ON" and "OFF" touch switches 128 and 129 similarly share a receiver pad 150. It will be seen that each of the rear pads 136 forms a capacitor with at least one of the touch pads disposed on the front side of the panel 38.

In the particular arrangement illustrated, the rear pads 136 need not be transparent and therefore may be made of any suitble conductive material, such as metallic silver or copper. In order to conceal the rear pads 136 from view for a pleasing appearance, a layer 152 of black paint (FIG. 9) is applied to the rear side of the panel 38, underneath the rear pads 136, the window 42 being defined by a suitable break in the paint layer 152.

The nature of the conductive touch pads 120 through 126 is such that are not readily visible to the casual observer, but are discernible only upon close examination. However, the painted lines delineating the individual touch sensitive areas 58 through 66 and the "ON" and "OFF" touch-sensitive areas 78 and 82 are readily visible and, in conjunction with the visible outline of the window 42, guide a person's touch.

To facilitate electrical connection between the rear pads 136 and a circuit means 156, an electrically insulating subpanel 158 (FIG. 9) is mounted behind and spaced from the rear panel 38. The subpanel 158 carries suitable spring contact clips such as the clips 160 and 162 which contact the rear pads 136. Representative transmitter (T) and receiver (R) conductors 164 and 166 connect the spring contact clips 160 and 162 to the circuit means 156.

The subpanel 158 additionally carries the individual display segments 46 through 54 comprising the array 44. In FIG. 9, the representative display segment 54 is joined to the subpanel 158 at 167 by any suitable means such as by gluing. In FIGS. 8 and 9, each of the individual display segments 46 through 54 may be seen to comprise a neon lamp 168 mounted in a suitable red plastic light dispersing lens element. The lens elements are preferably rectangular when viewed from the front thereof, and have suitable light scattering surface roughness so as to produce a solid block of light when the neon bulbs 168 are energized. To complete the mechanical arrangement, conductors 170 and 172 connect the electrodes of the representative neon lamp 168 in FIG. 9 to the circuit means 156.

The indicator display lamp 86 for the "ON" touch-sensitive area 78 is similar to the display segments 46 through 54. The display 86 is positioned behind a window 174, similar to the window 42, so as to be visible through the "ON" touch pad 120.

In the operation of the representative input/output device 30, the touch control bar graph device 37 is initially disabled such that the ultimate load device, for example the surface unit 22, is not energized. If a user merely touches the touch control bar graph device 37 while it is in the disabled condition, preferably the touch control bar graph device 37 does not respond, and in any event the ultimate load device is not energized.

When the user touches the ON touch-sensitive area 78, the circuit means 156 responds to enable the touch control bar graph device 37. Additionally, the display lamp 86 indicates the enabled condition. Thereafter, when a user touches any one of the individual touch sensitive areas 58 through 66, the circuit means 156 responds to properly drive the display array 44 to form a bar graph. Additionally, the circuit means 156 sends suitable signals to external circuitry (not shown) to cause the appropriate control function, for example establishing a desired heat setting, to be accomplished. This operation is described in greater detail in the above-mentioned Serrano application, Ser. No. 908,317.

To briefly summarize, decoding logic (described later with particular reference to FIG. 11) within the circuit means 156 is arranged such that when any single one of the touch pads 122 through 126 is touched, an output signal representing a corresponding primary touch-sensitive area 58, 60, 62, 64 or 66 is produced. When any two adjacent touch pads are simultaneously touched, an output signal representing a secondary touch-sensitive area 59, 61, 63 or 65 associated with the two touch pads is generated. The different signals thus generated by the decoding logic are applied to a means (described hereinafter with particular reference to FIGS. 10–15) for energizing the display segments 46 through 54 to produce the bar graph display.

At any time, the user can disable the touch control bar graph device 37 and thus de-energize the load by touching the OFF touch-sensitive area 80.

As previously mentioned, the arrangement requires two user operations to enable the touch control bar graph device 37 and energize the load device. Any attempt to enable operation of the device 37 by moving a finger directly between the ON touch-sensitive area 78 and the touch contol bar graph device 37 in one continuous motion results in at least a momentary touching of the OFF touch sensitive area 82.

While FIGS. 8 and 9 illustrate details of the FIG. 2 embodiment only, it will be appreciated that the embodiments of FIGS. 3–7 may similarly be constructed. In FIGS. 2 and 8 the ON and OFF touch-sensitive areas 78 and 82 each correspond to a particular touch switch touch pad. Specifically, the ON touch-sensitive area 78 corresponds to the touch pad 120 of the touch switch 128, and the OFF touch-sensitive area 82 corresponds to the touch pad 121 of the touch switch 129. However, as is taught in the above-referenced Serrano application Ser. No. 908,317, there need not be a one-for-one correspondence between touch-sensitive areas and touch pads. In particular there may be more touch-sensitive areas than touch pads, with logic circuitry being employed to respond to a simultaneous touching of two adjacent touch pads and to generate an output indicative of this condition. For example, in the FIG. 3 embodiment, the de-energizing touch-sensitive area positioned over the space 94 does not correspond to a particular touch switch touch pad, but rather is recognized by a simultaneous touching of adjacent touch pads.

Referring now to FIGS. 10–15, one example of suitable circuitry for operating the input/output device 30 of FIGS. 2, 8 and 9 will be described. It will be appreciated, however, that similar circuitry may be employed to operate the embodiments of FIGS. 3–7. It will be further appreciated that the circuitry illustrated and described is exemplary only and that many different schemes are possible, including microprocessor based systems executing a sequence of instructions stored in a program memory.

Figure 10:
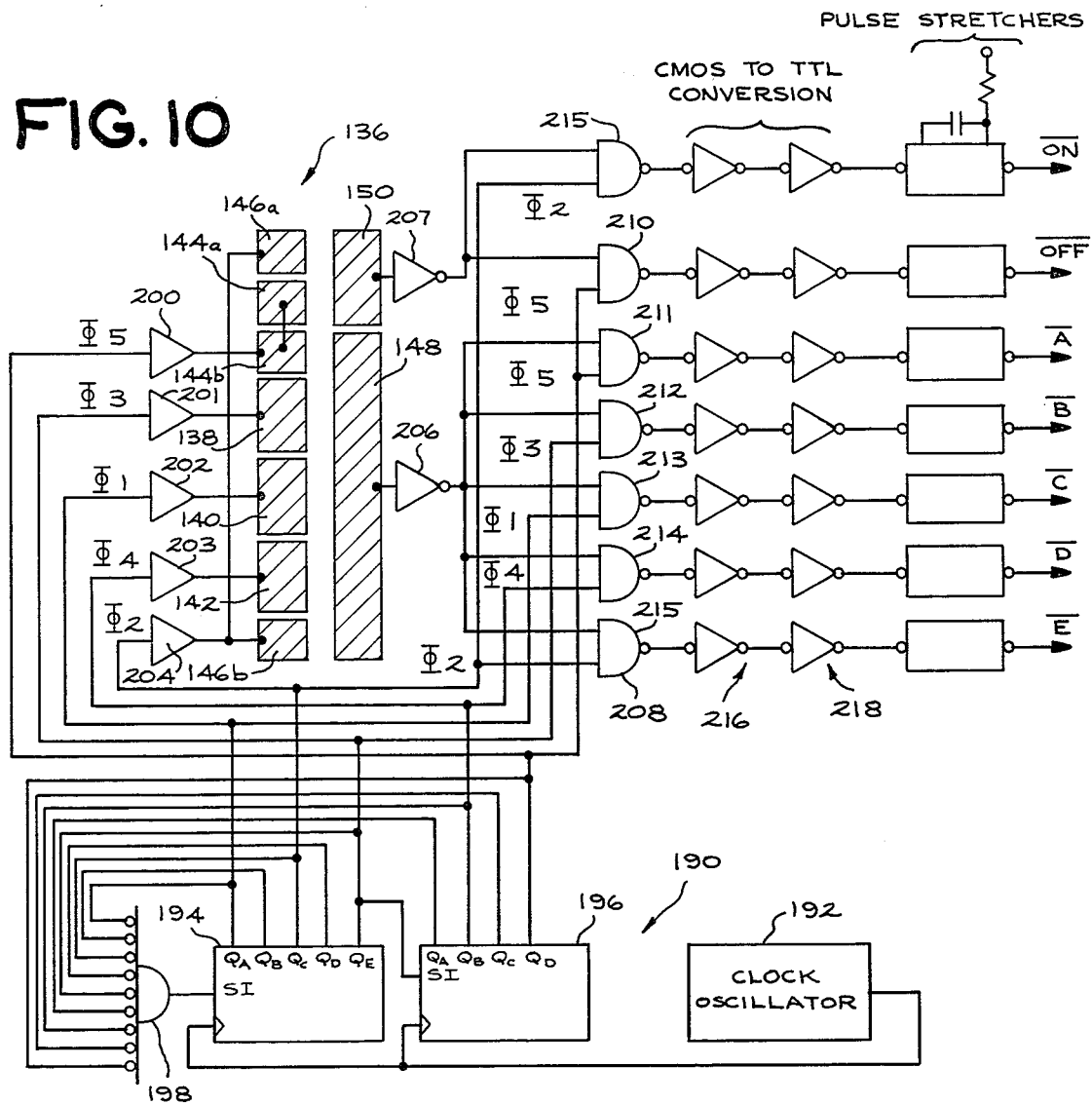
FIG. 10 is a portion of a schematic diagram of a representative electrical circuit suitable for operating in the embodiments of FIGS. 2, 8 and 9, and more particularly the touch switch portion of the circuitry.

In FIG. 10, the rear transmitter pads 138, 140, 142, 144 and 146 of FIG. 8 are represented, along with suitable circuitry for driving the transmitter pads. Similarly, the rear receiver pads 148 and 150 are represented along with suitable circuitry connected to receive the outputs therefrom. The front touch pads 120 through 126 visible in FIG. 8 are not shown in FIG. 10.

In contrast to the touch switch transmitter and receiver circuitry of the copending Welch, Serrano and Chen application Ser. No. 750,559 now U.S. Pat. No. 4,121,204 which uses individual channels for each of the touch switches therein, the embodiment described herein uses a multiplexing technique which requires significantly fewer electrical connections between the circuitry itself and the rear pads 136. However, as previously stated, the specific circuitry described herein is exemplary only and specific circuit details, including the multiplexing arrangement, are not a part of the invention claimed herein.

The digital logic elements employed herein are of two families: CMOS and TTL. The CMOS logic may comprise elements selected from the CD-4000 series of integrated circuits manufactured by RCA Corporation, and the TTL logic elements may comprise SN7400 series integrated circuits manufactured by Texas Instruments, Inc.

Considering specifically the transmitter circuitry of FIG. 10, a five-phase clock, generally designated 190, comprises a suitable square wave oscillator 192 operating on a frequency of approximately 100 KHz, and a pair of serially connected five-bit shift register 194 and 196 with their clock (CK) inputs driven by the clock oscillator 192. The five-bit shift registers 194 and 196 may comprise SN7496 TTL IC's. To prevent overlapping outputs, every other shift register output along the chain is taken to provide the five clock phase outputs. Specifically, from the first five-bit shift register 194, the $Q_A$ output drives the $\Phi 1$ line, the $Q_C$ output drives the $\Phi 2$ line, and the $Q_E$ output drives the $\Phi 3$ line. From the second five-bit shift register 196, the $Q_B$ output drives the $\Phi 4$ line and the $Q_D$ output drives the $\Phi 5$ line. The Serial Input (SI) of the first shift register 194 receives the output of a nine input, low-activated AND gate 198 having its inputs connected to the $Q_A$ through $Q_E$ outputs of the first shift register 194 and the $Q_A$ through $Q_D$ outputs of the second shift register 196.

The logical equivalent of the low-activated AND gate 198 may be constructed from three SN7427 TTL 3-input NOR gates supplying the inputs of an SN7410 TTL 3-input NAND gate followed by an SN7404 TTL inverter.

In the operation of the five-phase clock 190, logic highs are applied to the serial input (SI) of the first shift register 194 and clocked through in response to pulses from the clock oscillator 192 to successively appear at each of the Q outputs. Upon initial powering up of the circuit, the output of the AND gate 198 remains low, and this low applied to the first shift register 194 SI input causes all the shift register stages to eventually be cleared to logic low in response to clock pulses. When all the Q outputs are low, the output of the low-activated AND gate 198 goes high, inserting a logic high into the A stage of the first shift register 194, and this logic high is then clocked through in response to clock pulses.

The five clock lines are applied to the inputs of five transmitter pad drivers 200 through 204, which have their outputs connected to the transmitter pads 144, 138, 140, 142 and 146. The drivers 200 through 204 have high voltage transistor outputs, and provide approximately 160 volts to the transmitter pads.

The common receiver pad 144 is connected to a high impedance input inverter/buffer amplifier 206, and the receiver pad 150 for the ON and OFF switches to another high impedance input/inverter/buffer amplifier 207. Both inverters 206 and 207 may comprise CD4049 CMOS IC's. A demultiplexing network 208 comprises five NAND gates 210 through 214, each of which has its upper input connected to the output of the common buffer amplifier 206 and its lower input connected to one of the clock lines $\Phi 1$ through $\Phi 5$. For the "ON" and "OFF" touch switches, another NAND gate 215 has its upper input connected to the output of the inverter 207, and its lower input to the clock phase line $\Phi 5$. The NAND gates 210 through 215 may comprise CD4011 CMOS NAND gates.

In the operation of the de-multiplexing network 208, each of the NAND gates is interrogated in sequence by a logic high on the corresponding one of the clock lines $\Phi 1$ through $\Phi 5$. If the corresponding touch pad is not touched, the logic high present on the corresponding transmitter pad is capacitively coupled to the common receiver pad 148, changed to logic low by the inverter 206, and applied to the upper input of the corresponding one of the NAND gates 210 through 214. The NAND gate is not activated and its output therefore remains high. If, however, one or more of the touch pads is touched, then the logic high applied to the receiver pad in response to the particular clock phase is shunted by the touch. The receiver pad 148 goes low. The resultant logic high at the output of the inverter 206 applied to the upper input of the corresponding NAND gate of the demultiplexing network 208 in coincidence with a logic high from the particular clock phase line causes the output of the NAND gate of the demultiplexing network 208 to go low, indicating that the corresponding touch switch has been activated. The NAND gates 215 and 210 for the "ON" and "OFF" touch switches operate similarly.

The outpts of the NAND gates 210 through 215 are applied through first and second sets of buffers 216 and 218 to effect CMOS to TTL conversion. The first buffers 216 may be type CD4050 CMOS buffers, and the second buffers 218 may be type SN7407 TTL buffer amplifiers. Suitable output pull up resistors are required.

To enhance noise immunity, the outputs of the buffers 218 are followed by a set of pulse stretchers 220. Each of the pulse stretchers 220 may comprise for example a type SN74123 TTL retriggerable monostable multivibrator, with suitable external resistance and compacitance to provide an output pulse of 30 microseconds duration when triggered. To provide low-active inputs and low active outputs of the pulse stretchers 220, the "A" inputs and the $\overline{Q}$ outpts of the SN74123 IC's are used.

The output lines of the pulse stretchers 220 are designated $\overline{OFF}$ and $\overline{A}$ through $\overline{E}$. Each of these lines goes low when the corresponding one of the touch switches 128 through 134 (FIG. 8) is touched.

Figure 11:
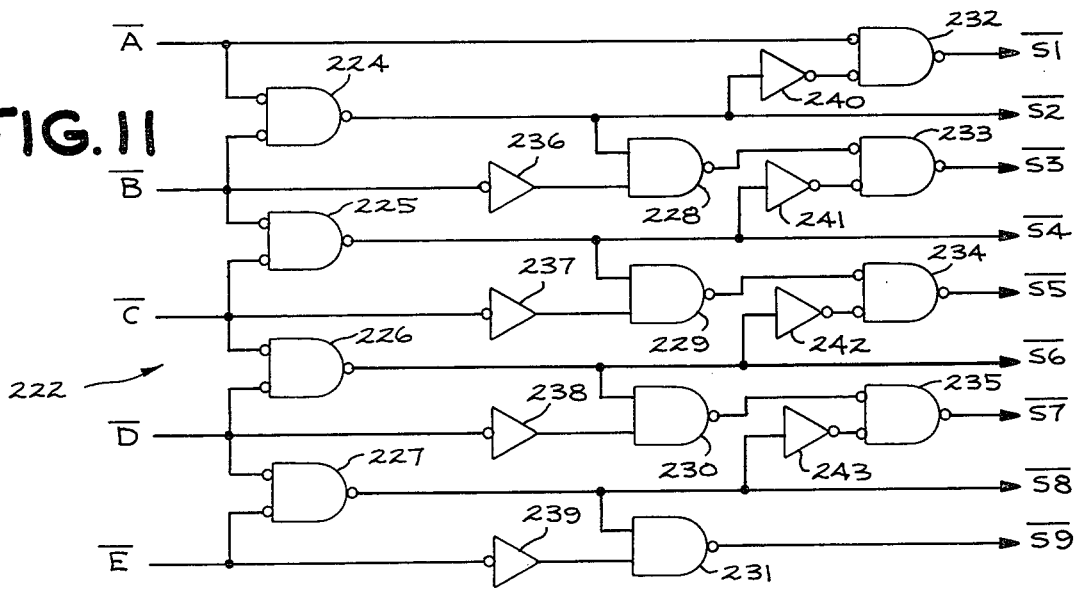
FIG. 11 is the decoding logic portion of the electrical circuit.

The $\overline{A}$ through $\overline{E}$ outputs of the circuit of FIG. 10 are applied to the inputs of the circuit of FIG. 11. In particular, FIG. 11 illustrates decoding logic 222 for generating different outputs in response to the touching of each of the touch sensitive areas 58 through 66 (FIG. 8). The decoding logic 222 receives the five lines $\overline{A}$ through $\overline{E}$, and has nine Signal (S) output lines $\overline{S1}$ through $\overline{S9}$. The lines $\overline{S1}, \overline{S3}, \overline{S5}, \overline{S7}$ and $\overline{S9}$ may be considered primary output lines, and the lines $\overline{S2}, \overline{S4}, \overline{S6}$ and $\overline{S8}$ secondary output lines.

More specifically, the decoding logic 222 is arranged such that when any single touch pad is touched and only one of the input lines $\overline{A}$ through $\overline{E}$ goes low, then an output signal representing the corresponding primary touch sensitive area is generated. Specifically, if the touch pad 122 (FIG. 8) is touched, then the $\overline{A}$ line goes low and, at the output of the decoding logic 222, the $\overline{S1}$ primary output line goes low. If the touch pad 123 is touched, the $\overline{B}$ line goes low and at the output of the decoding logic 222, and $\overline{S3}$ primary output line goes low. Similarly, for the touch pad 124, the $\overline{C}$ and $\overline{S5}$ lines go low, for the touch pad 125, the $\overline{D}$ and $\overline{S7}$ lines go low, and for the touch pad 126, the $\overline{E}$ and the $\overline{S9}$ lines go low.

The decoding logic 222 further functions such that when any two adjacent touch pads are simultaneously touched, an output signal representing the secondary touch sensitive area associated with the two pads is produced. For example, if the touch pads 122 and 123 of FIG. 8 are simultaneously touched, then the $\overline{A}$ and $\overline{B}$ input lines both go low, and the $\overline{S2}$ secondary output line goes low. Other adjacent pairs of the $\overline{A}$ through $\overline{E}$ inputs, when activated, produce corresponding outputs a the $\overline{S4}, \overline{S6}$ and $\overline{S8}$ secondary outputs.

The particular decoding logic 222 illustrated and described herein is quite straightforward to implement once the function it performs has been defined. It will therefore be appreciated that numerous variations are possible. Further, the decoding described may be accomplished through a microprocessor control system following suitable instructions stored in a program memory.

Considering now the specific decoding logic 222 of FIG. 11, the $\overline{S2}, \overline{S4}, \overline{S6}$ and $\overline{S8}$ secondary output lines carry the signals representing two adjacent touch pads being touched. To provide these particular outputs, four low activated NAND gates 224 through 227 are provided, each of the low-activated NAND gates 224 through 227 having its two inputs connected to an adjacent pair of the $\overline{A}$ through $\overline{E}$ input lines. The outputs of the low-activated NAND gates 224 through 227 directly supply the secondary output lines $\overline{S2}, \overline{S4}, \overline{S6}$ and $\overline{S8}$. Each of the low-activated NAND gates 224 through 227 may comprise the logic equivalent of an SN7402 TTL NOR gate followed by an SN7404 inverter.

The remaining logic elements in the decoding logic 222 serve to ensure that when any single one of the touch switches 93 through 97 (FIG. 3) is activated by itself and the corresponding input line $\overline{A}$ through $\overline{E}$ goes low, only one of the primary $\overline{S}$ outputs is activated; and to further ensure that when a "bridged" input occurs, none of the primary outputs $\overline{S1}, \overline{S3}, \overline{S5}, \overline{S7}$ and $\overline{S9}$ are activated.

Generally speaking, NAND gates 228 through 231 serve to ensure that a primary output cannot occur when the next lower secondary output is activated, and the low activated NAND gates 232 through 235 ensure that a primary output cannot occur when the next higher secondary output is activated. Each of the low activated NAND gates 232 through 235 is connected to drive one of the primary signal output lines $\overline{S1}, \overline{S3}, \overline{S5}$ or $\overline{S7}$ with the $\overline{S9}$ signal output line being driven directly by the output of the NAND gate 231. To complete the connections required for these functions, each of the NAND gates 228 throough 231 has its lower input connected back through one of the inverters 236 through 239 to the $\overline{B}$ through $\overline{E}$ inputs, and its upper inputs connected to the next lower secondary signal output line $\overline{S2}, \overline{S4}, \overline{S6}$ or $\overline{S8}$. Similarly, each of the lower activated NAND gates 232 through 235 has its upper input connected to the output of the corresponding NAND gate 228 through 231 (with the exception of the uppermost low activated NAND gate 232 which has its input connected directly to the A input line), and its lower input connected back through inverters 240 through 243 to the next higher one of the secondary output lines $\overline{S2}, \overline{S4}, \overline{S6}$ and $\overline{S8}$.

Since the decoding logic 222 repeats vertically, it is believed that its operation will be completely understood from a description of the operation during several exemplary input conditions, without considering every possible valid input condition. First, the input condition occurring when the primary touch sensitive area 62 (FIG. 8) is touched, contacting the touch pad 87 and activating the touch switch 95, will be considered. In FIG. 11, only the $\overline{C}$ input line is low and the remaining input lines are high. Since the $\overline{B}$ and $\overline{D}$ input lines are high, the low-activated NAND gates 225 and 226 are not activated, and their outputs remain high. Thus the $\overline{S4}$ and $\overline{S6}$ secondary outputs remain high. The output of the low activated NAND gate 225 also enables the NAND gate 229, and the output of the low activated NAND gate 226 enables the low activated NAND gate 234 through the inverter 242. With these two last-mentioned NAND gates enabled, the logic low at the input of the inverter 237 is changed to a logic high to activate the NAND gate 229, and the low output thereof activates the low-activated NAND gate 234, producing a logic low output on the $\overline{S5}$ primary output line. All of the other signal output lines remain high.

As another example, if the secondary touch sensitive area 61 (FIG. 8) is touched, then the touch pads 86 and 87 are both contacted, activating the touch switches 94 and 95. In this case, the FIG. 11 input lines $\overline{B}$ and $\overline{C}$ go low, with the $\overline{A}, \overline{D}$, and $\overline{E}$ lines remaining high. Under this condition, the output of the low-activated NAND gate 225 goes low, immediately producing the desired logic low signal output on the secondary signal output line $\overline{S4}$. Even though the $\overline{B}$ input line is also low, no $\overline{S3}$ output is generated because the logic low at the input of the inverter 241 causes a logic high at the output thereof, and the low-activated NAND gate 233 cannot be enabled.

With particular reference now to FIGS. 12 through 15, the circuitry which receives the Signal ($\overline{S}$) outputs from the decoding logic 222 of FIG. 11 will be described.

Figure 13:
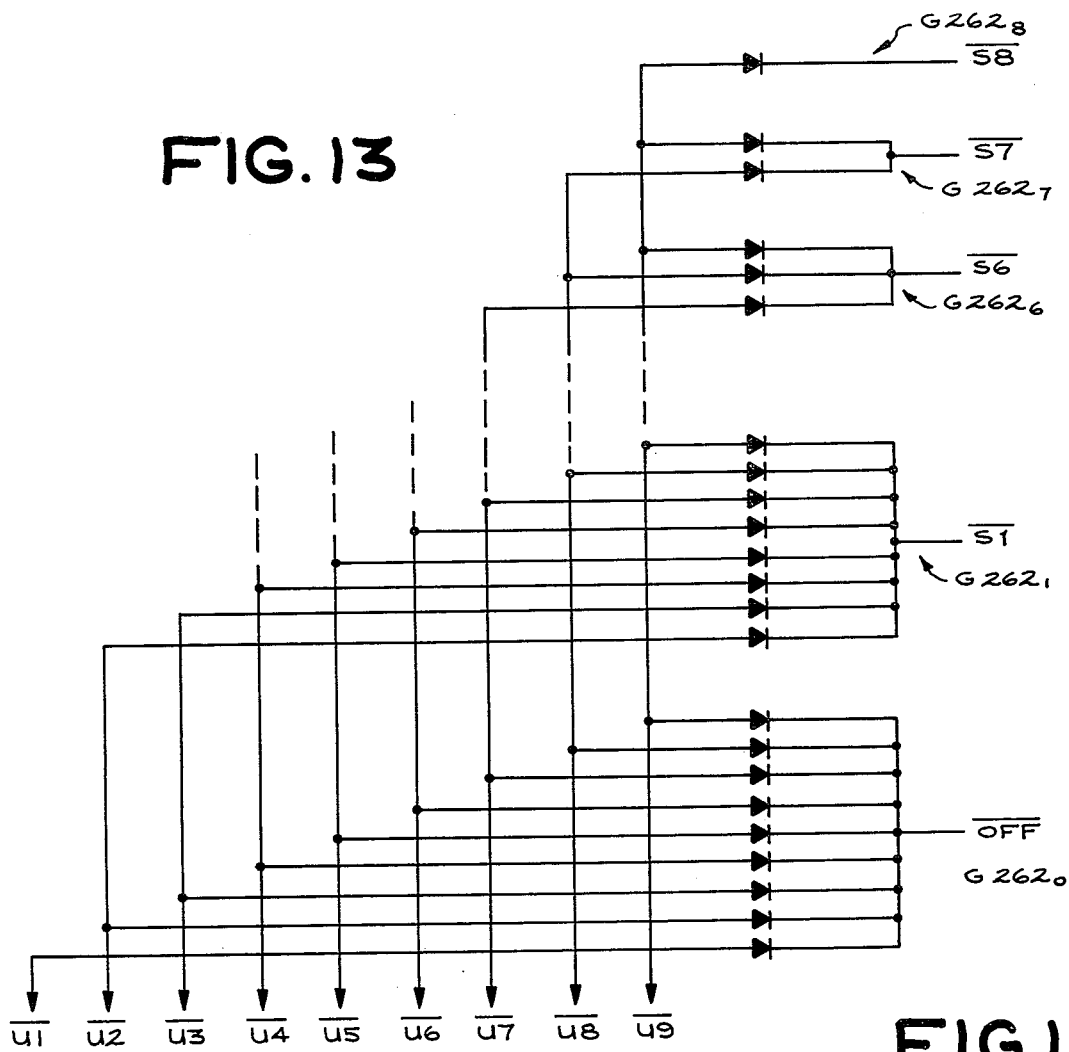
FIGS. 12 and 13 are schematic diagrams of an electrical circuit suitable for generating signals to drive the display portion of the embodiments of FIGS. 2, 8 and 9.
Figure 12:
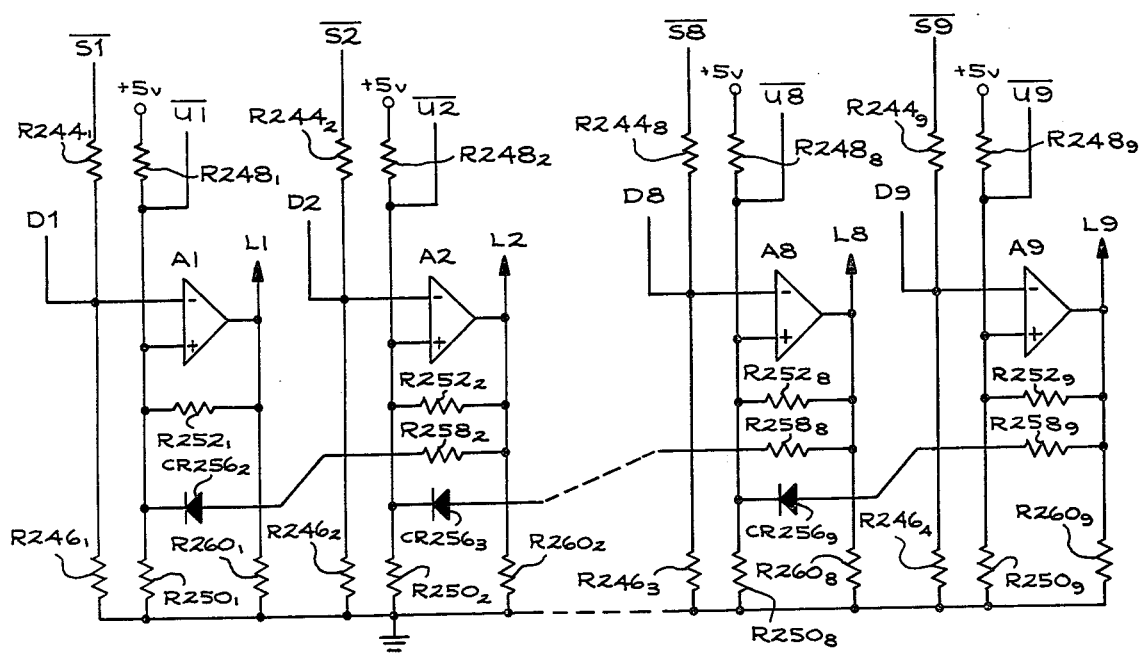
Figure 15:
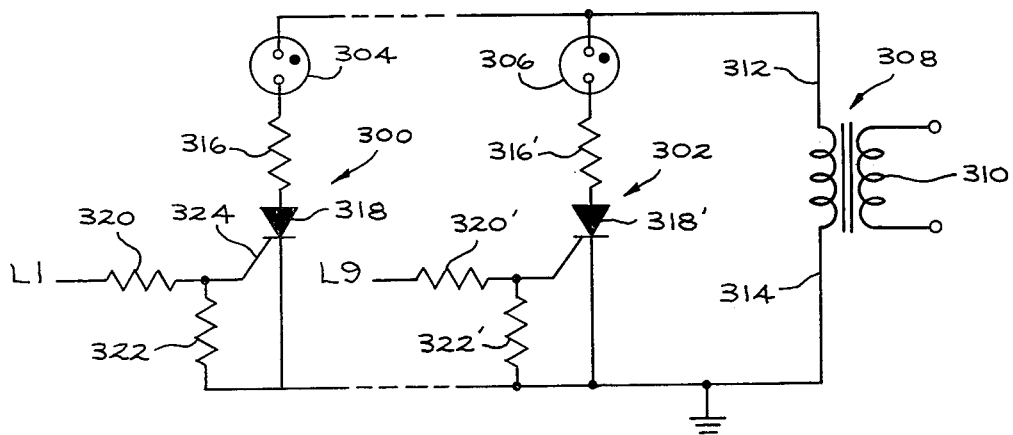
FIG. 15 shows circuitry suitable for driving the indicator lamps of FIGS. 8 and 9 to form a bar graph display.

In FIGS. 12 and 13, the circuitry receives the $\overline{S}$ lines from the decoding logic 222 of FIG. 8, and outputs suitable lamp (L) signals along the lines L1 through L9 to lamp drivers in FIG. 15. Additionally, signals available on the "L" lines are connected to other circuitry (not shown) within the appliance for controlling the actual operation thereof, for example to establish a particular heat setting.

The circuitry of FIG. 12 comprises nine individual circuit blocks, each circuit block being built around an operational amplifier connected as a voltage comparator, the nine amplifiers being designated A1 through A9. Each of the "A" amplifiers may comprise an integrated circuit operational amplifier such as a National Semiconductor type number LM301A. The lines $\overline{S1}$ through $\overline{S9}$ are connected through input resistors $R244_1$ through $R244_9$ to the inverting (−) inputs of the respective amplifiers A1 through A9. To prevent input overload at the inverting (−) inputs, each of the input resistors R244 is associated with a lower resistor R246, forming a voltage divider therewith.

To establish a comparison voltage in each of the individual blocks, each includes a reference voltage divider comprising a resistor R248 and a resistor R250 connected between a +5 volt DC source and a circuit ground. The resulting reference voltage is supplied to the non-inverting (+) input of each amplifier "A." Within each of the nine individual circuit blocks (with slight exceptions in the cases of A1 and A9), there are three additional contributions to the magnitude of the reference voltage. The first additional contribution is current flowing from the output terminal through the resistor R252 of each of the amplifiers to the reference voltage point at the non-inverting (+) amplifier input. The resistors R252 are positive feedback resistors and introduce hysteresis to cause each of the nine individual circuit blocks to function as a latch. The second additional contribution to the reference voltage is current flowing from a diode matrix 254 of FIG. 13 along unlatch ($\overline{U}$) lines to the reference voltage point. The third additional contribution is current flowing through latch up diodes CR256 and resistors R258 associated with succeeding circuit blocks. The amplifier A9 has no latch-up diode connected to its noninverting (+) input since there is no succeeding circuit block. Lastly, each of the individual circuit blocks blocks includes a stabilizing resistor R260 connected between the operational amplifier output and circuit ground.

In FIG. 13, the diode matrix 254 comprises nine diode groups $G262_0$ through $G262_8$. The cathodes of all the diodes in each group are connected together and to one of the first nine $\overline{S}$ lines from the decoding logic 222 of FIG. 8. Each succeeding diode group G262 262 includes one less diode than the preceding group. The diode anodes are connected to the $\overline{U}$ lines in the following manner: Each of the nine diodes in diode group $G262_0$ is connected to one of the $\overline{U}$ lines. Each of the eight diode anodes in the diode group $G262_1$ is connected to one of the $\overline{U}$ lines $\overline{U2}$ through $\overline{U9}$, omitting $\overline{U1}$. The sequence continues until the last diode group $G268_8$ includes only a single diode with its anode connected to the line $\overline{U9}$, omitting $\overline{U1}$ through $\overline{U8}$.

The operation of FIGS. 12 and 13 will be better understood if the general functions it must perform are preliminarily mentioned. First, each of the individual circuit blocks of FIG. 12 must accept a logic low Signal ($\overline{S}$) input indicating that one of the touch areas 58 through 66 (FIG. 8) has been touched and, since a touch is only momentary, must "remember" through a latching action. Second, each of the nine circuit blocks must output a signal along an appropriate Lamp (L) line, both to a lamp driver (FIG. 15), and to other circuitry (not shown) within the appliance. Thirdly, the circuitry must cause all the display segments in the array 44 (FIG. 8) to the left of the display segment associated with the touch sensitive area which is touched to be energized, doing this by latching up all the lower circuit blocks in the chain. Fourthly, the circuitry must de-energize the display segments by unlatching the circuit blocks to the right or higher in the chain from the touch sensitive area which is touched.

Now considering the operation specifically, when one of the touch sensitive areas 58 through 66 is touched, the corresponding $\overline{S}$ line goes low, pulling the inverting (−) input of the associated amplifier down below the reference potential supplied to the non-inverting (+) input. This causes the amplifier output to go high and, since the output of each amplifier is connected through a positive feedback resistor R252 back to the non-inverting (+) input, the potential on a non-inverting (+) input is raised sufficiently high to hold the amplifier in a latched on condition, even when the S line again goes high.

The output to the display drivers of FIG. 15 and to the additional circuitry (not shown) in the appliance is simply taken from the L lines connected to the output of the individual operational amplifiers "A."

In order to latch up lower circuit blocks in the chain when an intermediate touch area, for example the "MED" touch area 62 is touched, a positive voltage flows from the output of the amplifier associated with the touch area which is touched back through the resistor R258 and the diode CR256 to the non-inverting (+) input of the preceding amplifier A, biasing the amplifier sufficiently to cause its output to go high. This sends a signal along the associated L line and, additionally, continues the chain backwards to latch up the next preceding amplifier block, continuing until amplifier A1 is reached.

Lastly, in order to unlatch succeeding circuit blocks in a chain, the diode matrix 254 of FIG. 13 receives the $\overline{S}$ inputs directly from the decoding logic 222 of FIG. 11, and additionally receives the $\overline{OFF}$ line from FIG. 10. The diode matrix 254 supplies logic low signals along the $\overline{U}$ lines directly to the non-inverting (+) inputs of the appropriate amplifiers A. These logic low signals are sufficient to overcome the positive voltage supplied to the positive feedback resistors R252, and therefore cause the succeeding amplifier circuits to unlatch.

Figure 14:
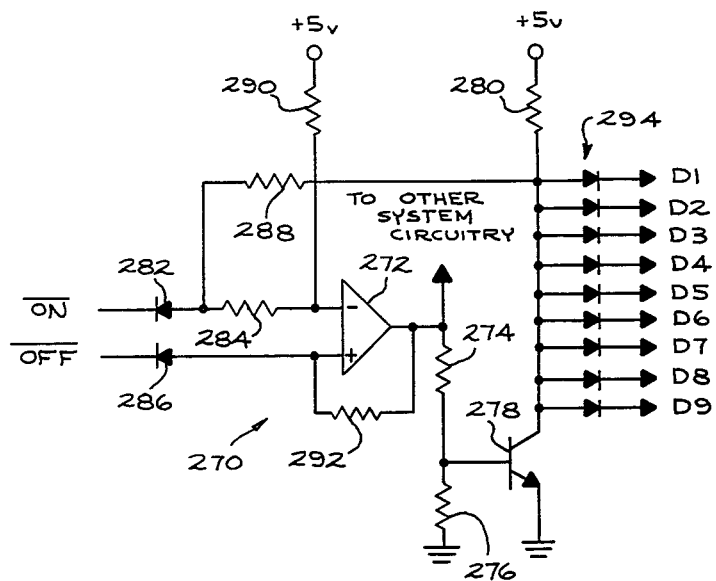
FIG. 14 is a schematic diagram of a representative electrical circuit for receiving signals from the ON and the OFF touch switches.

In FIG. 14, ON/OFF circuitry 270 comprises an operational amplifier 272, generally functioning as a latch. At the output of the operational amplifier 272, a voltage divider comprising resistors 274 and 276 supplies the base of an NPN transistor 278 connected in common emitter configuration. A load resistor 280 is connected between the transistor 278 collector and a +5 volt supply. On the input side, the $\overline{ON}$ line from FIG. 10 is connected through a diode 282 and an input resistor 284 to the inverting (−) input of the operational amplifier 272, and the $\overline{OFF}$ line through a diode 286 to the non-inverting (+) input. To latch the system in the off condition, a negative feedback resistor 288 connects the junction of the diode 282 and the input resistor 284 to the collector of the transistor 278. To ensure that the system enters the off condition upon initial powering up, a high valued resistor 290 connects the inverting (−) operational amplifier input to a +5 volt supply. To latch the system in the on condition, a positive feedback resistor 292 is connected between the operational amplifier non-inverting (+) input and the oerational amplifier output.

The output of the ON/OFF circuitry 270 comprises nine diodes 294 with their anodes all connected to the transistor 278 collector, and their cathodes supplying individual Disable (D) lines D1 through D9. The D lines are connected directly to the individual inverting (−) inputs of the amplifiers A in FIG. 12.

In the operation of the ON/OFF circuitry 270, the circuit initially powers up in the off condition, with the output of the amplifier 272 low, the transistor 272 off, and the D output lines all high. The resultant highs applied to the inverting (−) inputs of the amplifiers A in FIG. 12 ensure that each of the stages A1 through A9 is off. Thus the touch control bar graph device 37 is disabled, and the range surface unit 22 cannot be energized. When the "ON" touch-sensitive area 78 (FIG. 2) is touched, the touch switch 128 (FIG. 8) is activated, and the $\overline{\text{ON}}$ line at the output of FIG. 10 goes low. In FIG. 14, the low $\overline{\text{ON}}$ line pulls the voltage on the inverting () input below the voltage on the non-inverting (+) input, and the output of the operational amplifier 272 goes high. This turns on the transistor 278, which pulls the anodes of the diode 294 low, removing the logic highs on the D lines. This enables the circuitry of FIGS. 12 and 13 to function to drive the bar graph device 37 and thus enable the bar graph device 37 itself.

If at any time the "OFF" touch-sensitive area 82 (FIG. 2) is touched, the touch switch 129 (FIG. 8) is activated, and the $\overline{\text{OFF}}$ line at the output of FIG. 10 goes low. In FIG. 14, the low $\overline{\text{OFF}}$ line pulls the non-inverting (+) input low to place the circuit 270 in the off or disabling condition. The direct connection of the $\overline{\text{OFF}}$ line to the non-inverting (+) input of the operational amplifier 272, and the direct connections of the D lines to the non-inverting (+) inputs of the amplifier A in FIG. 12 ensure that an "OFF" signal overrides all other signals at any time.

Referring lastly to FIG. 15, there is shown typical circuitry for driving each of the nine display lamps in the array 44 (FIG. 8). Since the display drivers are all identical, only the first and ninth are shown, these being designated 300 and 302. The two lamps 304 and 306 are the lamps associated with the display segments 46 and 54 respectively, of FIG. 8. In FIG. 15, a transformer 308 with its primary winding 310 connected to a suitable source of AC voltage supplies 120 volts AC across its output terminals 312 and 314. Each of the lamps in driver circuits 300 and 302 is connected between the terminals 312 and 314 and is thereby supplied with an AC voltage.

The exemplary circuit 300 comprises a current limiting resistor 316 and a serially connected rectifier (SCR) 318 connected in series with the neon lamp 304. An input network comprising resistors 320 and 322 is connected to the gate terminal 324 of the SCR 318, the free end of the resistor 320 being connected to the input line L1. Corresponding elements of the circuit 302 are designated by primed reference numerals.

In the operation of the exemplary circuit 300 of FIG. 15, when a positive voltage is supplied to the input terminal L1, the SCR 318 is triggered into conduction, causing the neon lamp 304 to light. When the positive input voltage is removed, the SCR 318 ceases conducting, and the lamp 304 is extinguished.

The following table lists component values found suitable for the circuitry of FIGS. 12 through 15. It will of course be appreciated that these values are exemplary only and are included for the purpose of enabling one skilled in the art to practice the invention.

| Semiconductor Devices | |
|---|---|
| A1-A9, 272 | National LM301A integrated circuit operational amplifier |
| CR256, G262, 282, 286, 294 | 1N4148 diodes |
| 278 | 2N3415 transistor |

| Resistors | |
|---|---|
| R244 | 1 Meg ohms |
| R246 | 680 K ohms |
| R248 | 1 Meg ohms |
| R250 | 1 Meg ohms |
| R252 | 820 K ohms |
| R258 | 470 K ohms |
| R260 | 10 K ohms |
| 274 | 15 K ohms |
| 276 | 15 K ohms |
| 280 | 10 K ohms |
| 284 | 1 Meg ohms |
| 288 | 1 Meg ohms |
| 290 | 10 Meg ohms |
| 292 | 1 Meg ohms |
| 316 & 316' | 22 K ohms |
| 320 & 320' | 330 ohms |
| 322 & 322' | 1 K ohms |

While specific embodiments of the invention have been illustrated and described herein, it is realized that modifications and changes will occur to those skilled in the art. It is therefore to be understood that the appended claims are intended to cover all such modifications and changes as fall within the true spirit and scope of the invention.

What is claimed is:

1. In combination with a touch control bar graph device, an ON/OFF switch arrangement comprising:
   an ON touch-sensitive area positioned adjacent to but spaced from the touch control bar graph device;
   a de-energizing touch-sensitive area positioned in the space between said ON touch-sensitive area and the touch control bar graph device; and
   circuit means responsive to said ON touch-sensitive area and to said de-energizing touch-sensitive area for enabling operation of the touch control bar graph device in response to the touching of said ON touch-sensitive area and for disabling operation of the touch control bar graph device in response to the touching of said de-energizing touch-sensitive area;
   whereby any attempt by a user to enable operation of the touch control bar graph device by moving a finger directly between said ON touch-sensitive area and the touch control bar graph device results in disbling of the touch control bar graph device.

2. An arrangement according to claim 1, wherein said de-energizing touch-sensitive area corresponds to a particular touch switch touch pad.

3. An arrangement according to claim 1, wherein said ON touch-sensitive area corresponds to a particular touch switch touch pad, and wherein said de-energizing touch-sensitive area bridges the touch pad corresponding to said ON touch-sensitive area and a touch pad of the touch control bar graph device.

4. An arrangement according to claim 1, wherein said de-energizing touch sensitive area is a clearly designated OFF touch-sensitive area.

5. An arrangement according to claim 4 wherein said clearly designated OFF touch-sensitive area corresponds to a particular touch switch touch pad.

6. An arrangement according to claim 4, wherein said OFF touch-sensitive area is visually dominant compared to said ON touch-sensitive area.

7. An arrangement according to claim 4, wherein said ON and OFF touch-sensitive areas are positioned adjacent one end of the touch control bar graph device.

8. An arrangement according to claim 7, wherein the touch control bar graph device is oriented horizontally.

9. An arrangement according to claim 8, wherein the touch control bar graph device has a plurality of legends representing relative values increasing from left to right.

10. An arrangement according to claim 9, wherein the legends are range surface unit heat settings.

11. An arrangement according to claim 7, wherein the touch control bar graph device is oriented vertically.

12. An arrangement according to claim 11, wherein the touch control bar graph device has a plurality of legends representing relative values increasing from bottom to top.

13. An arrangement according to claim 12, wherein the legends are range surface unit heat settings.

14. An arrangement according to claim 4, wherein the touch control bar graph device is oriented horizontally and has a plurality of legends representing relative values increasing from left to right, and wherein said ON and OFF touch-sensitive areas are positioned adjacent the left end of the touch control bar graph device.

15. An arrangement according to claim 14, wherein the legends are range surface unit heat settings.

16. An arrangement according to claim 4, wherein the touch control bar graph device is oriented vertically and has a plurality of legends representing relative values increasing from bottom to top, and wherein said ON and OFF touch-sensitive areas are positioned adjacent the lower end of the touch control bar graph device.

17. An arrangement according to claim 16, wherein the legends are range surface unit heat settings.

18. An arrangement according to claim 1, wherein said ON touch-sensitive area is positioned adjacent one end of the touch control bar graph device, and which arrangement further comprises a designated OFF touch-sensitive area positioned adjacent the other end of the touch control bar graph device, said circuit means also being responsive to said OFF touch-sensitive area for disabling operation of the touch control bar graph device in response to the touching of said OFF touch-sensitive area.

19. An arrangement according to claim 18, wherein said ON touch-sensitive area corresponds to a particular touch switch touch pad, and wherein said de-energizing touch-sensitive area bridges the touch pad corresponding to said ON touch-sensitive area and a touch pad of the touch control bar graph device.

20. An arrangement according to claim 18, wherein the touch control bar graph device is oriented horizontally and has a plurality of legends representing relative values increasing from left to right, said ON touch-sensitive area is positioned adjacent the left end of the touch control bar graph device, and said OFF touch-sensitive area is positioned adjacent the right end of the touch control bar graph device.

21. An arrangement according to claim 20, wherein said ON touch-sensitive area corresponds to a particular touch switch touch pad, and wherein said de-energizing touch-sensitive area bridges the touch pad corresponding to said ON touch-sensitive area and a touch pad of the touch control bar graph device.

22. An arrangement according to claim 18, wherein the touch control bar graph device is oriented vertically and has a plurality of legends representing relative values increasing from bottom to top, said ON touch-sensitive area is positioned adjacent the upper end of the touch control bar graph device, and said OFF touch-sensitive area is positioned adjacent the lower end of the touch control bar graph device.

23. An arrangement according to claim 22, wherein said ON touch-sensitive area corresponds to a particular touch switch touch pad, and wherein said de-energizing touch-sensitive area bridges the touch pad corresponding to said ON touch-sensitive area and a touch pad of the touch control bar graph device.

24. In combination with a horizontally oriented touch control bar graph device having a plurality of legends representing relative values increasing from left to right, an ON/OFF switch arrangement comprising:
an ON touch-sensitive area positioned adjacent to but spaced from the left end of the touch control bar graph device;
an OFF touch-sensitive area positioned in the space between said ON touch-sensitive area and the touch control bar graph device; and
circuit means responsive to said ON and OFF touch-sensitive areas for enabling operation of the touch control bar graph device in response to the touching of said ON touch-sensitive area, and for disabling operation of the touch control bar graph device in response to the touching of said OFF touch-sensitive area;
whereby any attempt by a user to enable operation of the touch control bar graph device by moving a finger directly between said ON touch-sensitive area and the touch control bar graph device results in disabling of the touch control bar graph device.

25. An arrangement according to claim 24, wherein the legends are range surface unit heat settings.

26. An arrangement according to claim 24, which further comprises an indicator lamp for said ON touch-sensitive area, said indicator lamp coupled to said circuit for indicating when said touch control bar graph is enabled.

27. In combination with a vertically oriented touch control bar graph device having a plurality of legends representing relative values increasing from bottom to top, an ON/OFF switch arrangement comprising:
an ON touch-sensitive area positioned adjacent to but spaced from the upper end of the touch control bar graph device;
a de-energizing touch-sensitive area positioned in the space between said ON touch-sensitive area and the upper end of the touch control bar graph device;
an OFF touch-sensitive area positioned adjacent the lower end of the touch control bar graph device; and
circuit means responsive to said touch-sensitive areas for enabling operation of the touch control bar graph device in response to the touching of said ON touch-sensitive area, and for disabling operation of the touch control bar graph device in response to the touching of either said de-energizing touch-sensitive area or said OFF touch-sensitive area;

whereby any attempt by a user to enable operation of the touch control bar graph devices by moving a finger directly between said ON touch-sensitive area and the touch control bar graph device results in disabling of the touch control bar graph device.

28. An arrangement according to claim 27, wherein said ON touch-sensitive area corresponds to a particular touch switch touch pad, and wherein said de-energizing touch sensitive area bridges the touch pad corresponding to said ON touch-sensitive area and a touch pad of the touch control bar graph device.

29. An arrangement according to claim 27, which further comprises an indicator lamp for said ON touch-sensitive area, said indicator lamp coupled to said circuit means for indicating when said touch control bar graph is enabled.

* * * * *